United States Patent [19]
Lee

[11] Patent Number: 5,939,932
[45] Date of Patent: Aug. 17, 1999

[54] HIGH-OUTPUT VOLTAGE GENERATING CIRCUIT FOR CHANNEL BREAKDOWN PREVENTION

[75] Inventor: Won-Kee Lee, Kumi-si, Rep. of Korea

[73] Assignee: LG Semicon Co., Ltd., Chungcheongbuk-Do, Rep. of Korea

[21] Appl. No.: 08/921,377

[22] Filed: Aug. 29, 1997

[30] Foreign Application Priority Data

Dec. 21, 1996 [KR] Rep. of Korea ................. 96-69652

[51] Int. Cl.$^6$ ................................................ H03K 17/10
[52] U.S. Cl. ........................ 327/436; 327/437; 327/333; 327/108; 326/81; 326/83; 326/121
[58] Field of Search ........................... 326/121, 86, 83, 326/81, 80, 34, 9; 327/108, 333, 389, 427, 434, 436, 437

[56] References Cited

U.S. PATENT DOCUMENTS

| | | | |
|---|---|---|---|
| 5,414,314 | 5/1995 | Thurber, Jr. ............................. | 326/68 |
| 5,465,054 | 11/1995 | Erhart ..................................... | 326/34 |
| 5,534,798 | 7/1996 | Phillips et al. ......................... | 326/68 |
| 5,604,449 | 2/1997 | Erhart et al. ........................... | 326/121 |
| 5,748,025 | 5/1998 | Ng et al. ................................ | 327/333 |

*Primary Examiner*—Timothy P. Callahan
*Assistant Examiner*—Terry L. Englund
*Attorney, Agent, or Firm*—Morgan, Lewis & Bockius LLP

[57] ABSTRACT

A high-output voltage generating circuit that prevents transistor breakdown includes first and second switching circuits coupled to each other at a first common gate, the first common gate being connected to a first control signal, and the first and second switching circuits being connected to a common input signal; third and fourth switching circuits coupled to each other at a second common gate, the second common gate being connected to a second control signal; a signal output unit having first and second transistors coupled to each other at a third common gate, the third common gate being connected to the second control signal; a third transistor, coupled to a first voltage, receiving a first signal at a gate from the first switching circuit; a fourth transistor, coupled to the third transistor, receiving a second signal from the third switching circuit at a gate, the fourth transistor being coupled to the first transistor of the signal output unit; a fifth transistor, coupled to the second transistor of the signal output unit, receiving a third signal at a gate from the fourth switching circuit; and a sixth transistor, coupled to the fifth transistor, receiving a fourth signal at a gate from the second switching circuit, the sixth transistor being connected to a second voltage.

25 Claims, 8 Drawing Sheets

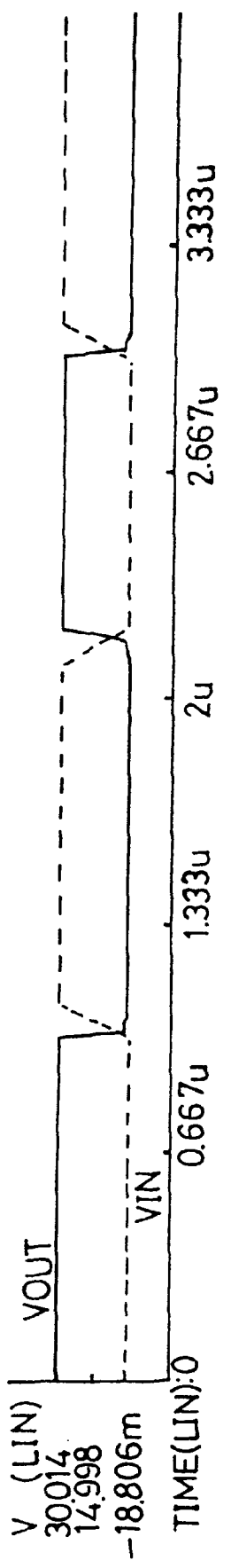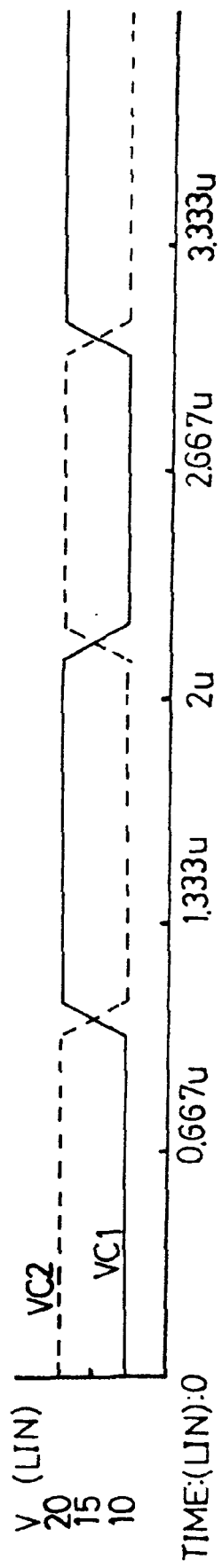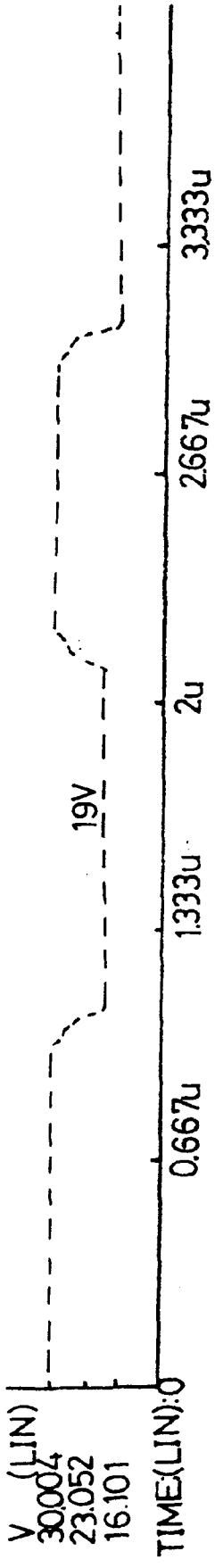

HIGH-OUTPUT VOLTAGE GENERATING CIRCUIT FOR CHANNEL BREAKDOWN PREVENTION

This application claims the benefit of Korean Application No. 96-69652, filed on Dec. 21, 1996, which is hereby incorporated by reference.

BACKGROUND OF THE INVENTION

1. Field of the Invention

The present invention relates to a semiconductor device, and more particularly, to a semiconductor device in a CMOS circuit.

2. Discussion of the Related Art

In general, as a semiconductor device becomes more highly integrated, the channel length of an MOS transistor becomes shorter. Accordingly, the channel break-down voltage decreases and a high-output voltage is not generated. Therefore, a conventional semiconductor is provided to solve the problem as follows.

As illustrated in FIG. 1, a conventional semiconductor device for generating high-output voltage includes a first PMOS transistor P1 having a gate for receiving a threshold voltage VSHLD for controlling its operation, and a source for receiving an input signal. A second PMOS transistor P2 has a gate for receiving a signal output from the drain of the first PMOS transistor P1 and a source for receiving a predetermined positive voltage VDD. A third PMOS transistor P3 has a source for receiving a signal output from the drain of the second PMOS transistor P2 and a gate for receiving the threshold voltage VSHLD. A first NMOS transistor N1 has a gate for receiving the threshold voltage VSHLD and a drain for receiving the input signal. A second NMOS transistor N2 has a gate for receiving a signal output from the source of the first NMOS transistor N1 and a source for receiving a ground potential. A third NMOS transistor N3 has a source connected to the drain of the second NMOS transistor N2, a drain for receiving the voltage of the drain of the third PMOS transistor P3, and a gate for receiving the threshold voltage VSHLD.

Here, the substrate bias voltage of the first through third PMOS transistors P1 to P3 is fixed as the positive voltage VDD. The substrate bias voltage of the first to third NMOS transistors N1 to N3 is fixed as the ground potential.

The thus-structured conventional semiconductor device for preventing a channel break-down is shown in U.S. Pat. No. 5,465,054. Now, the operation of the above-mentioned device will be described below.

If the threshold voltage is set to 5 V DC and the positive voltage VDD for operating the transistor is set to 10 V, the first and third PMOS transistors P1 and P3 and the first and third NMOS transistors N1 and N3 are constantly turned on. Here, the second NMOS transistor N2 and PMOS transistor P2 are separately turned on/off according to the input voltage state. Accordingly, if the input voltage is at a low level, the second PMOS transistor P2 is turned on while the second NMOS transistor N2 is turned off. Therefore, the positive voltage VDD (the operation voltage) is applied to the common drain of the third PMOS and NMOS transistors P3 and N3, thereby maintaining the high level.

On the other hand, if the input voltage is at a high level, the second PMOS transistor P2 is turned off while the second NMOS transistor N2 is turned on. Therefore, the ground voltage is applied to the common drain of the third PMOS and NMOS transistors P3 and N3, thereby maintaining the low level. Here, although the potential state of the input signal is classified into the low and high levels, the voltage states are relative and do not specifically mean 0 V or 5 V.

As described above, even though the output voltage varies from 0 V to 10 V, the voltages between the source and the drain of each of the second and third PMOS transistors P2 and P3 for performing a pull-up function, and of the second and third NMOS transistors N2 and N3 for performing a pull-down function are both restricted to 5 V. This is so that the circuit can prevent the transistor channel break down due to the variation of the output voltage. Therefore, the circuit may generate an output voltage that is two times the channel break-down voltage.

However, in such a conventional semiconductor device, if the positive operation voltage VDD is increased to 10 V through 15 V to obtain the very high-output voltage, the voltages between the source and the drain of each of second and third PMOS transistors P2 and P3 and of the second and third NMOS transistors N2 and N3 become about 7.5 V. Moreover, if the operation positive voltage VDD is increased to 30 V, the voltage between the source and drain becomes about 15 V. When the operation positive voltage VDD is excessively increased, the sources and drains of the transistors P2, P3, N2, N3 also receive the excessively increased voltage. Accordingly, those transistors experience a channel break-down, resulting in circuit malfunction. As a result, when the increasing range of the operational positive voltage is more than a predetermined threshold voltage, the conventional circuit cannot output a voltage of more than two times the channel break down voltage.

SUMMARY OF THE INVENTION

Accordingly, the present invention is directed to a semiconductor device for generating a high-output voltage that substantially obviates one or more of the problems due to limitations and disadvantages of the related art.

An object of the present invention is to provide a semiconductor device for generating high-output voltage having a large variation width of voltage applied to the output and a low channel break-down voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an output voltage generating semiconductor device comprises first and second switching circuits activated and deactivated according to a first control signal having a predetermined level and cycle, each of the first and second circuits outputting an external input signal during an alternate activation of the first and second switching circuits; third and forth switching circuits activated and deactivated according to a second control signal, and outputting the first control signal during an alternate activation of the third and fourth circuits; a signal output unit having a combination of PMOS transistor and NMOS transistor, the signal output unit pulling up a voltage applied to a common drain to a voltage applied to a source of the PMOS transistor according to a first state of the second control signal applied to a gate of the PMOS transistor, the signal output unit pulling down the voltage applied to a common drain to a voltage applied to a source of the NMOS transistor according to a second state of the second control signal applied to a gate of the NMOS transistor; a first PMOS transistor receiving a low signal output at a gate during an activation of the first switching circuit, and outputting a driving voltage output from a source to a drain; a second PMOS transistor receiving a high signal at a gate during an activation of the third switching circuit, and temporarily storing the driving voltage from the first PMOS transistor, the second PMOS transistor being activated during a deactivation operation of the third switching circuit to apply the temporarily stored voltage to the source of the PMOS transistor of the signal output unit; a first NMOS transistor receiving a low signal at a gate during an activation of the fourth switching circuit, temporarily storing the voltage applied to the source of the NMOS transistor of the signal output unit at a drain of the first NMOS transistor, and the transistor being activated to apply the temporarily stored voltage at the drain to a source of the first NMOS transistor; and a second NMOS transistor receiving a high state signal at a gate to activate the second NMOS transistor and reducing the voltage at the source of the first NMOS transistor applied to the drain of the second NMOS transistor to a ground potential.

In another aspect of the present invention, an output voltage generating semiconductor device comprises first and second switching circuits activated and deactivated according to a first control signal, the first and second circuits outputting an input signal during an alternate activation of the first and second switching circuits; third and fourth switching circuits activated and deactivated according to a second control signal, and outputting the first control signal during an alternate activation of the third and fourth circuits; a signal output unit having first and second transistors coupled to each other and to the second control signal, the signal output producing a first output voltage according to a first state of the second control signal and producing a second output voltage according to a second state of the second control signal; a third transistor coupled to a driving voltage source and receiving a first signal at a gate during an activation of the first switching circuit, the third transistor outputting a driving voltage; a fourth transistor, coupled to the third transistor, receiving a second signal of a first state at a gate during an activation of the third switching circuit and storing the driving voltage from the third transistor, the fourth transistor receiving the second signal of a second state during a deactivation of the third switching circuit and outputting the stored driving voltage to the first transistor of the signal output unit; a fifth transistor receiving a third signal at a gate during an activation of the fourth switching circuit, storing an output voltage from the second transistor of the signal output unit, and outputting the stored output voltage when activated; and a sixth transistor, coupled to the fifth transistor, receiving a fourth signal at a gate during an activation of the second switching circuit and reducing the stored output voltage from the fifth transistor to a ground potential.

In another aspect of the present invention, an output voltage generating semiconductor device comprises first and second switching circuits coupled to each other at a first common gate, the first common gate being connected to a first control signal, and the first and second switching circuits being connected to a common input signal; third and fourth switching circuits coupled to each other at a second common gate, the second common gate being connected to a second control signal; a signal output unit having first and second transistors coupled to each other at a third common gate, the third common gate being connected to the second control signal; a third transistor, coupled to a first voltage, receiving a first signal at a gate from the first switching circuit; a fourth transistor, coupled to the third transistor, receiving a second signal from the third switching circuit at a gate, the fourth transistor being coupled to the first transistor of the signal output unit; a fifth transistor, coupled to the second transistor of the signal output unit, receiving a third signal at a gate from the fourth switching circuit; and a sixth transistor, coupled to the fifth transistor, receiving a fourth signal at a gate from the second switching circuit, the sixth transistor being connected to a second voltage.

In a further aspect of the present invention, a high-output voltage output generative semiconductor device, includes first and second switching circuits turned on/off according to a first control signal, each signal having a predetermined level and cycle, but an opposite phase, each circuit outputting an external signal input during the turn/on operation, so that they operate alternately; third and fourth switching circuits turned on/off according to the second control signal, and outputting the first control signal input during the turn-on operation, so that they operate alternately; a signal output part formed of a CMOS type inverter, namely, the combination of PMOS transistor and NMOS transistor, and pulling up a voltage applied to a common drain into a voltage applied to the source of the PMOS transistor according to a state of the second control signal input to the gate, or pulling down the voltage applied to a common drain into the voltage applied to the source of the NMOS transistor; a first PMOS transistor for receiving a low signal output from the gate during the turn-on operation of the first switching circuit, and outputting the driving voltage output from the source to the drain; a second PMOS transistor for receiving a high signal from the gate during the turn-on operation of the third switching circuit, and temporarily storing the driving voltage input of the source, and the transistor being turned on during the turn-off operation of the third switching circuit so as to apply the temporarily applied voltage to the source of the PMOS transistor of the signal output part; a first NMOS transistor for receiving a low signal to the gate during the turn-on operation of the fourth switching circuit, temporarily storing the voltage applied to the source of the NMOS transistor of the signal output part which is input to the drain, and the transistor being turned on so as to apply the temporarily stored voltage of the drain to the source; and a second NMOS transistor for receiving the high state signal by the gate, and then making the voltage of the source of the first NMOS transistor applied to the drain conductive to the ground potential.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings:

FIGS. 4A to 4F illustrate example voltage waveform of each part of FIG. 2 when the operation voltage is 30 V.

DETAILED DESCRIPTION OF THE PREFERRED EMBODIMENTS

Reference will now be made in detail to the preferred embodiments of the present invention, examples of which are illustrated in the accompanying drawings.

Figure 1:
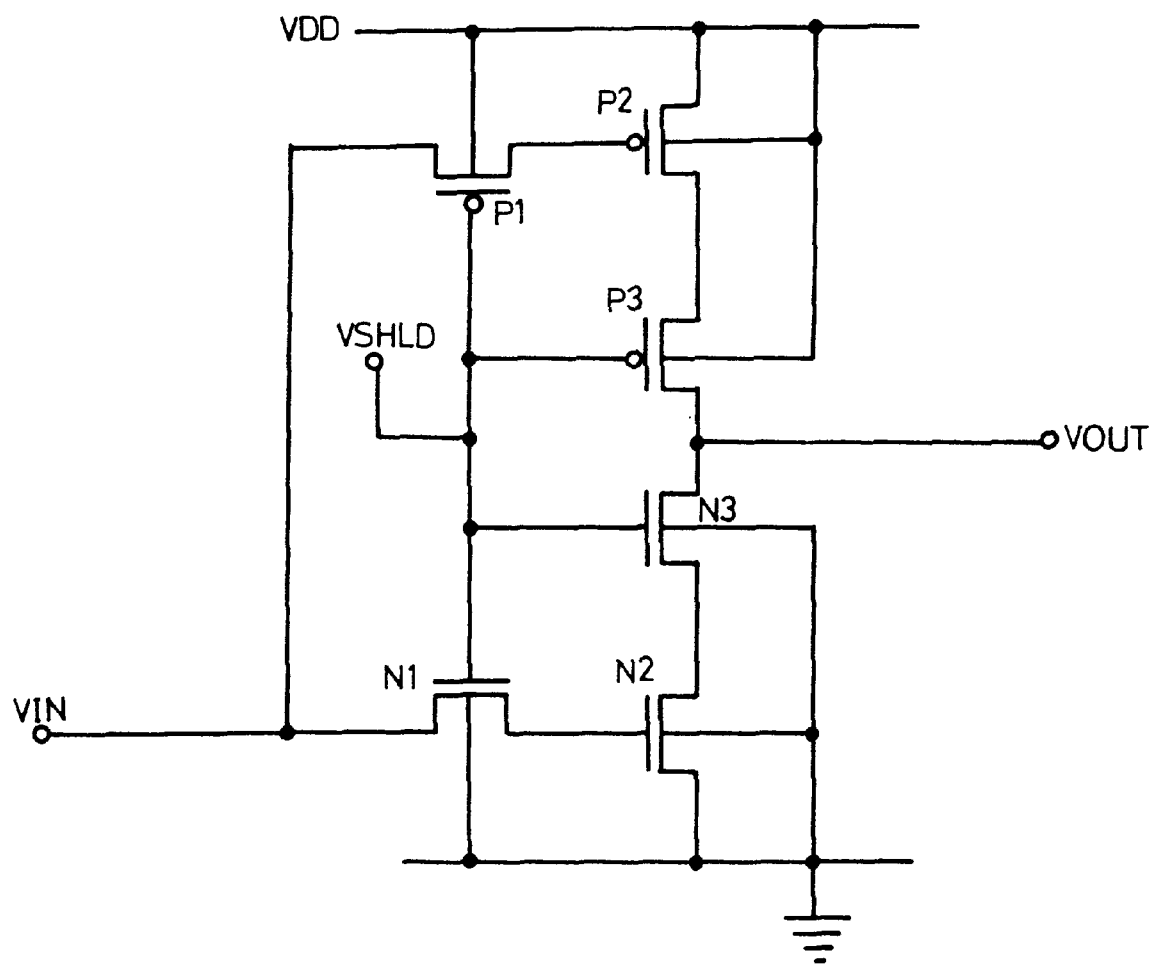
FIG. 1 is a block diagram of a conventional semiconductor device for generating high-output voltage.
Figure 2:
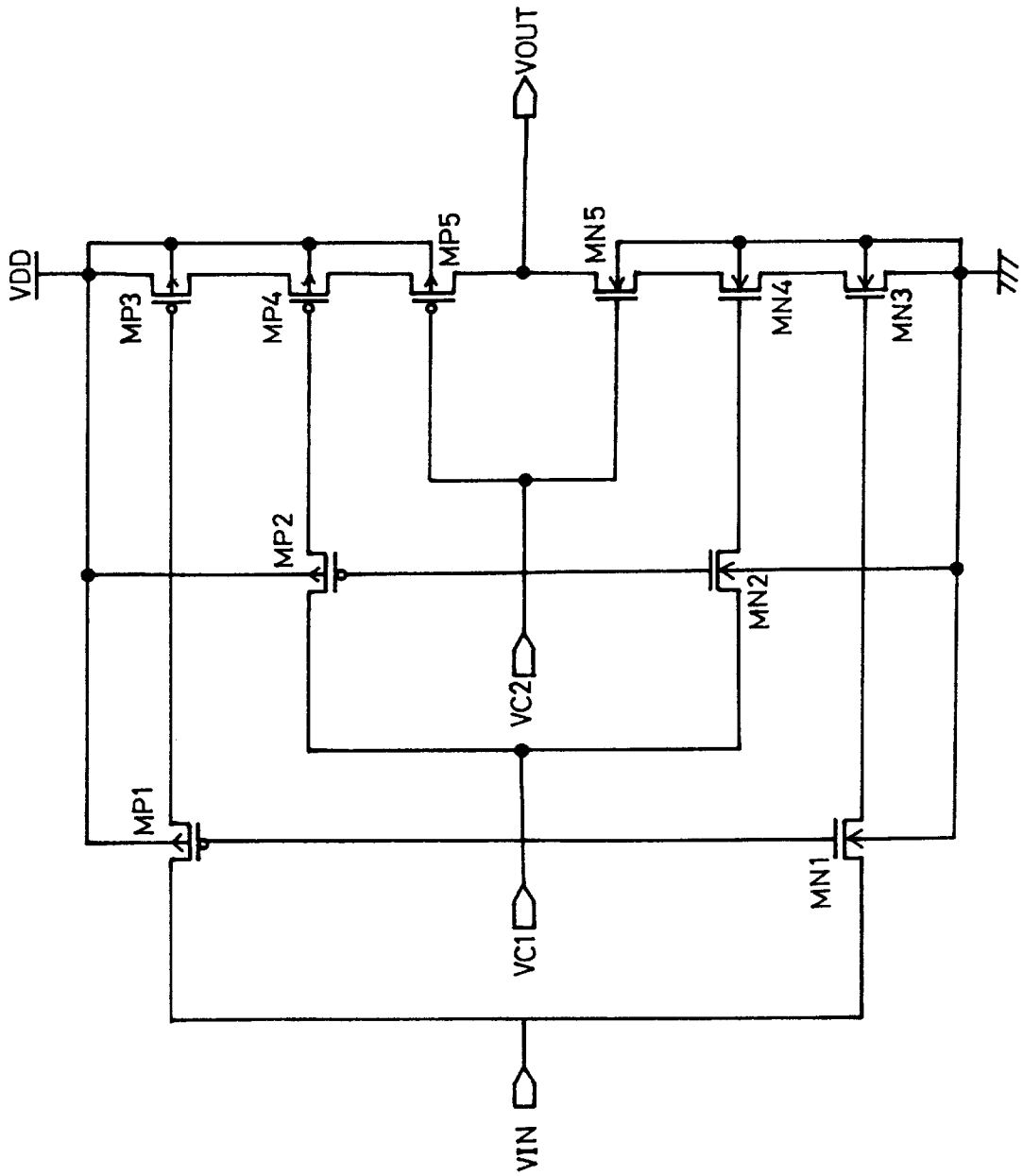
FIG. 2 is a block diagram of a semiconductor device for generating high-output voltage of the present invention.

As illustrated in FIG. 2, a preferred embodiment of a semiconductor device of the present invention includes a first PMOS transistor MP1 having a gate for receiving a first control voltage VC1 with a predetermined level, and a source for receiving an input signal VIN. A second PMOS transistor MP2 has a gate for receiving a second control voltage VC2 with a predetermined level, and a source for receiving the first control voltage VC1. A third PMOS transistor MP3 has a gate for receiving a signal output from the drain of the first PMOS transistor MP1, and a source for receiving a predetermined positive voltage VDD. A fourth PMOS transistor MP4 has a source for receiving a signal output from the drain of the third PMOS transistor MP3, and a gate for receiving a signal output from the drain of the second PMOS transistor MP2. A fifth PMOS transistor MP5 has a gate for receiving the second control voltage VC2, and a source for receiving a signal output from the drain of the fourth PMOS transistor MP4. A first NMOS transistor MN1 has a gate for receiving the first control voltage VC1, and a drain for receiving the input signal VIN. A second NMOS transistor MN2 has a gate for receiving the second control voltage VC2, and a drain for receiving the first control voltage VC1. A third NMOS transistor MN3 has a gate for receiving a signal output from the source of the first NMOS transistor MN1, and a source tied to ground potential. A fourth NMOS transistor MN4 has a source connected to the drain of the third NMOS transistor MN3, and a gate for receiving a signal output from the source of the second NMOS transistor MN2. A fifth NMOS transistor MN5 has a source connected to the drain of the fourth NMOS transistor MN4, and a drain for receiving voltage signal applied to the drain of the fifth PMOS transistor MP5.

With reference to FIGS. 3A to 5F, an operation of the thus-structured device of the present invention will be described below, where an operational voltage VDD is 15V for FIGS. 3A–3F, 30 V for FIGS. 4A–4F, and 10 V for FIGS. 5A–5F.

Figure 3A:
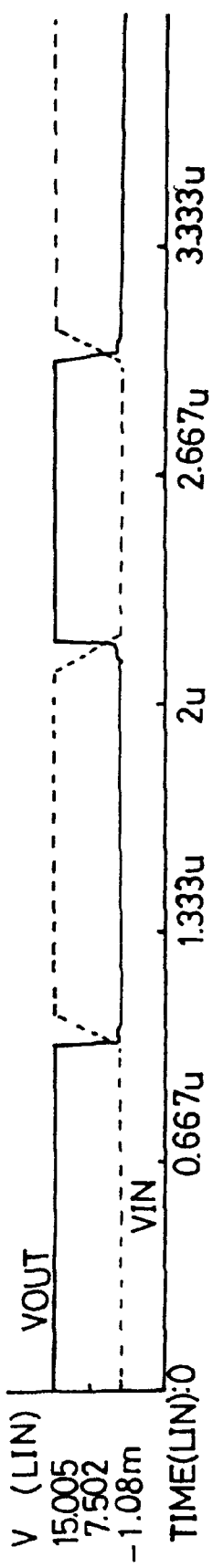
FIGS. 3A to 3F illustrate example voltage waveform of each part of FIG. 2 when the operation voltage is 15 V.
Figure 3B:
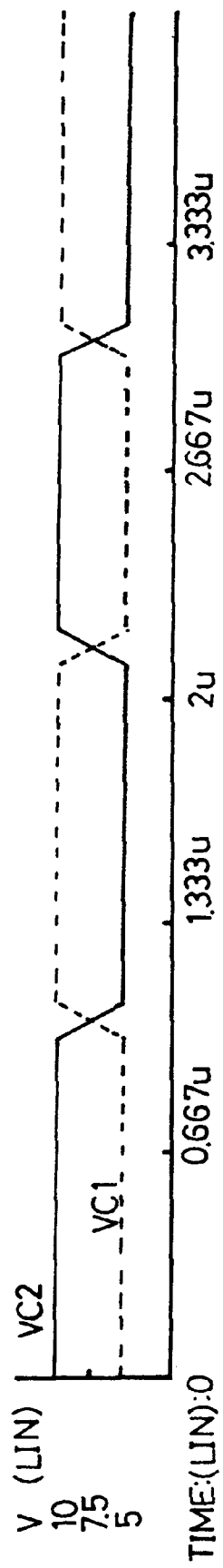
Figure 3C:
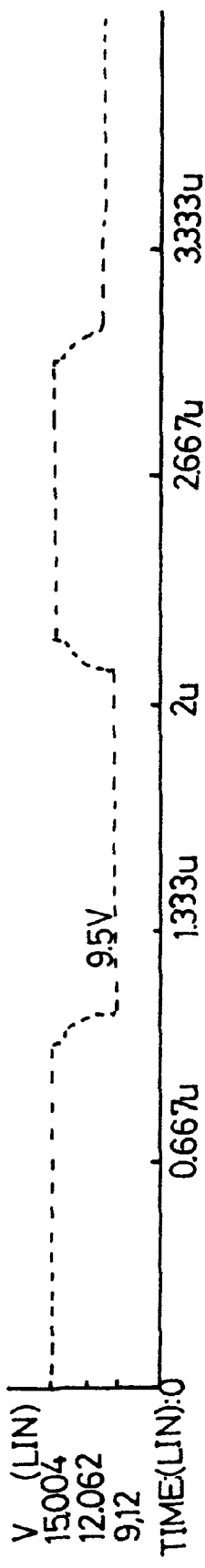
Figure 3D:
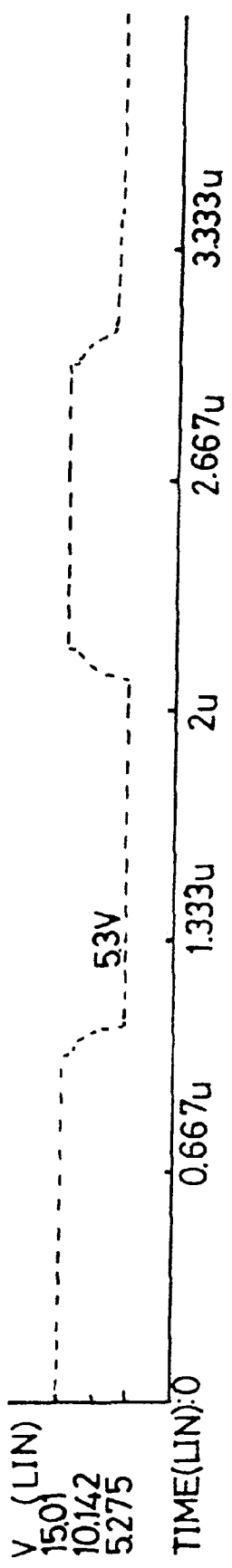
Figure 3E:
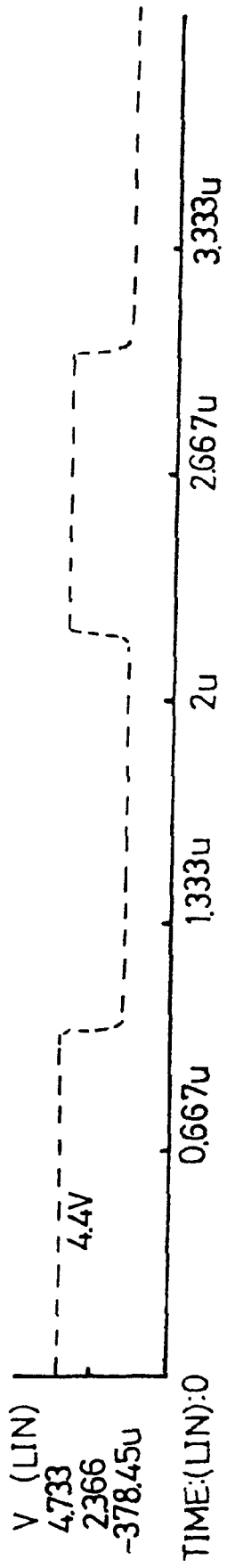
Figure 3F:
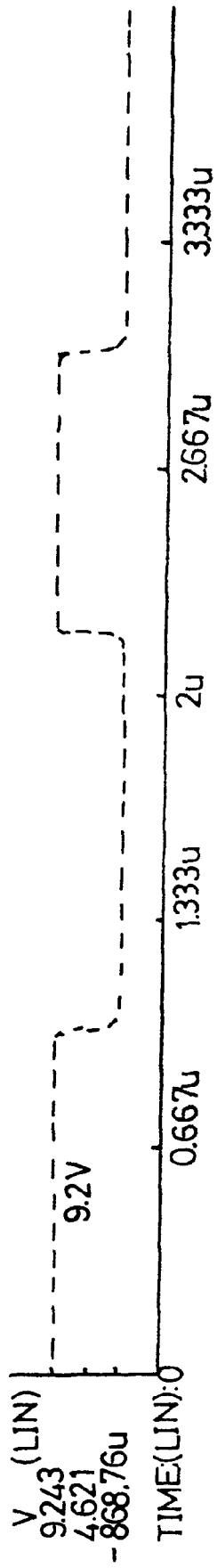
Figure 4D:
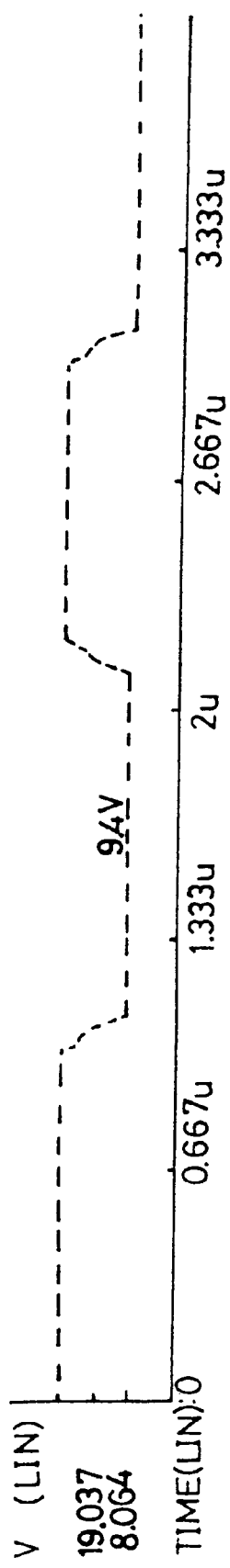
Figure 4E:
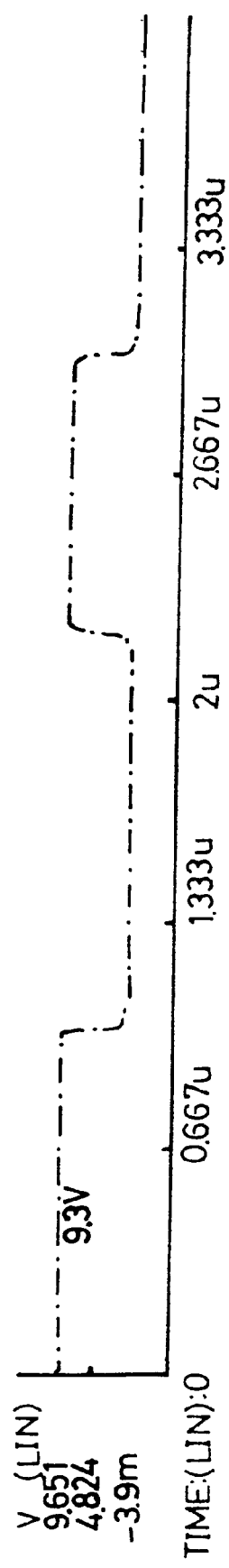
Figure 4F:
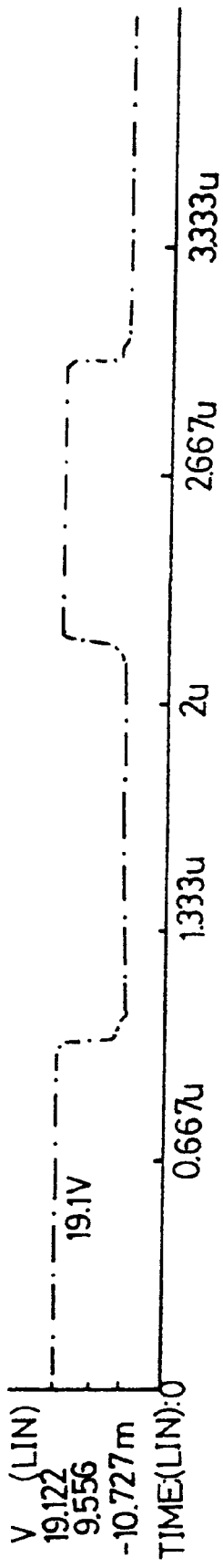
Figure 5A:
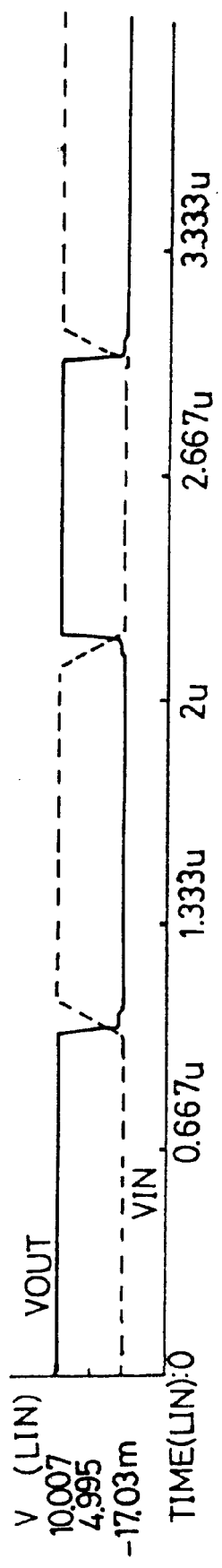
FIGS. 5A to 5F illustrate example voltage waveform of each part of FIG. 2 when the operation voltage is 10 V.
Figure 5B:
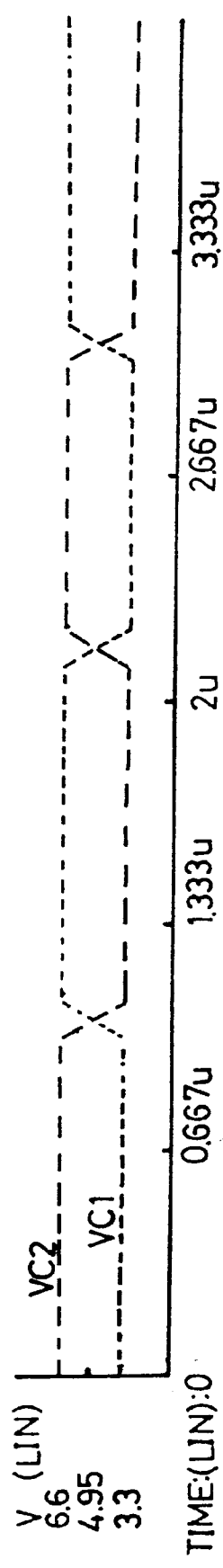
Figure 5C:
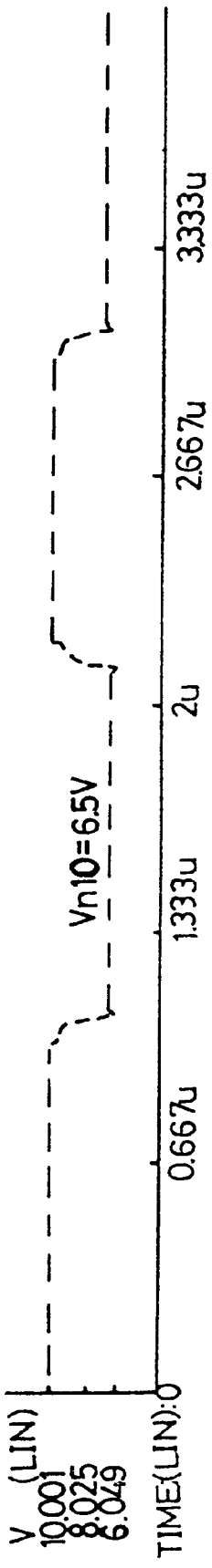
Figure 5D:
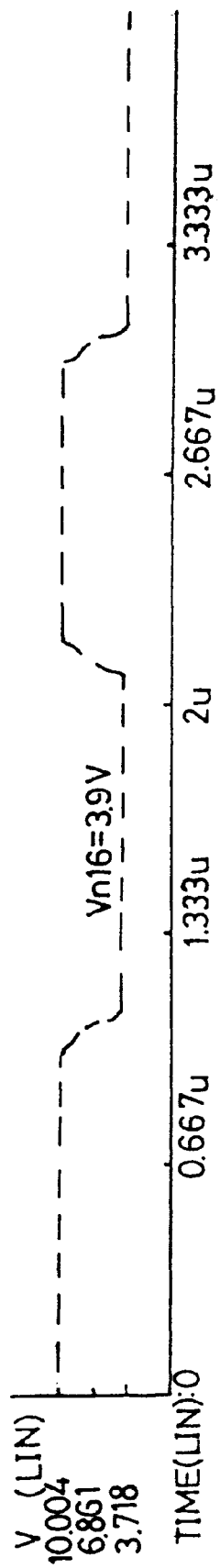
Figure 5E:
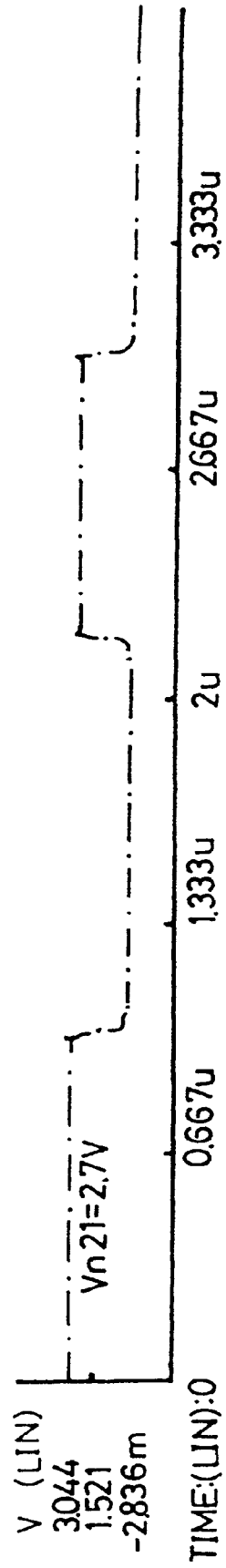
Figure 5F:
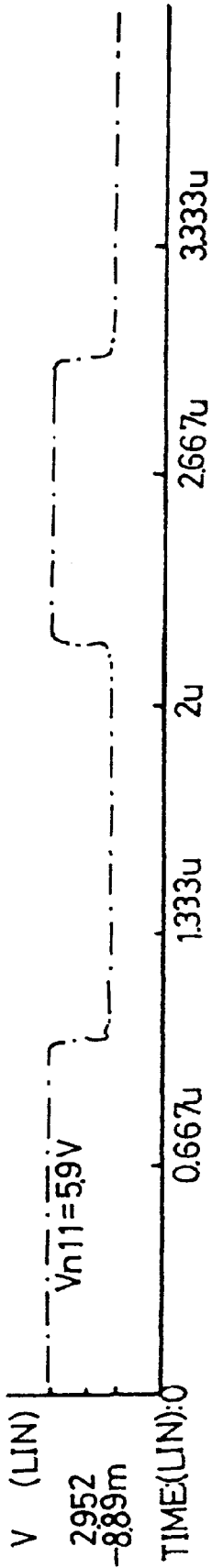

FIGS. 3A, 4A, 5A illustrate the voltage waveforms of the input/output signal according to the operational voltage. FIGS. 3B, 4B, 5B illustrate the voltage waveforms of the first and second control signals VC1 and VC2. In addition, FIGS. 3C, 4C, 5C illustrate the waveforms of the voltages output through the drain of the third PMOS transistor MP3, and applied to the source of the fourth PMOS transistor MP4. FIGS. 3D, 4D, 5D illustrate the waveforms of the voltages output from the drain of the fourth PMOS transistor MP4, and applied to the source of the fifth PMOS transistor MP5 and also to the pull-up node of the output port. FIGS. 3E, 4E, 5E illustrate the waveforms of the voltages that are applied to the drain of the third NMOS transistor MN3 and the source of the fourth NMOS transistor MN4. FIGS. 3F, 4F, 5F illustrate the waveforms of the voltages that are applied to the drain of the fourth NMOS transistor MN4 and the source of the fifth NMOS transistor MN5 and also to the pull-down node of the output port.

Therefore, when the operational voltage VDD is 15 V and the waveforms illustrated in FIG. 3B represent the voltages of the first and second control signals VC1 and VC2, each voltage between the respective sources and drains of the third through fifth PMOS and NMOS transistors MP3 to MP5 and MN3 to MN5, is restricted to 5 V. Thus, a channel break-down is prevented, allowing the circuit to operate normally.

In addition, when the operational voltage VDD is 30 V and those voltage waveforms illustrated in FIG. 4B are the voltages of the first and second control signals VC1 and VC2, each voltage between the sources and drains of the third through fifth PMOS and NMOS transistors MP3 through MP5 and MN3 through MN5, is restricted to 10V. Thus, the channel break-down is prevented, allowing the circuit to operate normally.

Likewise, when the operational voltage VDD is 10 V and those voltage waveforms illustrated in FIG. 5B are the voltages of the first and second control signals VC1 and VC2, each voltage between the sources and drains of the third through fifth PMOS and NMOS transistors MP3 through MP5 and MN3 through MN5, is restricted to about 3.5 V. Thus, the channel break-down is prevented, allowing the circuit to operate normally.

Accordingly, in the present invention, a maximum voltage of the first and second control signals VC1 and VC2 is about 66% of the driving voltage VDD, and a minimum voltage of the first and second control signals VC1 and VC2 is about 33% of the driving voltage VDD. The first control signal VC1 and the external input signal VIN have substantially the same phase. The second control signal VC2 has a phase opposite to that of the external input signal VIN. The source and drain of each of the third through fifth PMOS transistors or the source and drain of each of the third through fifth NMOS transistors, receive about 33% of the driving voltage VDD at any one time.

The present invention can output a voltage three times higher than the channel break-down voltage without changing the process, while the conventional invention is limited to only two times higher than the channel break-down voltage. Therefore, the present invention prevents the channel breakdown and reduces the channel length, thereby making the semiconductor chip smaller.

It will be apparent to those skilled in the art that various modifications and variations can be made in a semiconductor device for generating a high-output voltage of the present invention without departing from the spirit or scope of the invention. Thus, it is intended that the present invention cover the modifications and variations of this invention provided they come within the scope of the appended claims and their equivalents.

What is claimed is:

1. An output voltage generating semiconductor device, comprising:

first and second switching circuits activated and deactivated according to a first control signal having a predetermined level and cycle, each of the first and second switching circuits outputting an external input signal during an alternate activation of the first and second switching circuits;

third and forth switching circuits activated and deactivated according to a second control signal, and outputting the first control signal during an alternate activation of the third and fourth switching circuits;

a signal output unit having a combination of an output PMOS transistor and an output NMOS transistor, the signal output unit pulling up a voltage applied to commonly connected drains of the output PMOS transistor and the output NMOS transistor to a voltage applied to a source of the output PMOS transistor according to a first state of the second control signal applied to a gate of the output PMOS transistor, the signal output unit pulling down the voltage applied to the common drain connection to a voltage applied to a source of the output NMOS transistor according to a second state of the second control signal applied to a gate of the output NMOS transistor;

a first PMOS transistor having a gate for receiving a low state of the first control signal during an activation of the first switching circuit, and outputting a driving voltage output from a source to a drain;

a second PMOS transistor having a gate for receiving a high state of the first control signal during an activation of the third switching circuit, and temporarily storing the driving voltage from the first PMOS transistor, the second PMOS transistor being activated during a deactivation operation of the third switching circuit to apply the temporarily stored voltage to the source of the output PMOS transistor of the signal output unit;

a first NMOS transistor having a gate for receiving the low state of the first control signal during an activation of the fourth switching circuit, temporarily storing the voltage applied to the source of the NMOS transistor of the signal output unit at a drain of the first NMOS transistor, and the first NMOS transistor being activated to apply the temporarily stored voltage at the drain to a source of the first NMOS transistor; and a second NMOS transistor having a gate for receiving the high state of the first control signal to activate the second NMOS transistor and reducing the voltage at the source of the first NMOS transistor applied to the drain of the second NMOS transistor to a ground potential.

2. The device according to claim 1, wherein the signal output unit includes a CMOS type inverter including the combination of PMOS and NMOS transistors.

3. The device according to claim 1, wherein a maximum voltage of the first and second control signals is about 66% of the driving voltage.

4. The device according to claim 1, wherein a minimum voltage of the first and second control signals is about 33% of the driving voltage.

5. The device according to claim 1, wherein the first control signal and the external input signal are substantially in phase.

6. The device according to claim 1, wherein the second control signal has a phase opposite to a phase of the external input signal.

7. The device according to claim 1, wherein the source and drain of each of the first, second and third PMOS transistors, or the source and drain of each of the first, second and third NMOS transistors, receive about 33% of the driving voltage at any one time.

8. An output voltage generating semiconductor device, comprising:

first and second switching circuits activated and deactivated according to a first control signal, the first and second switching circuits outputting an input signal during an alternate activation of the first and second switching circuits;

third and fourth switching circuits activated and deactivated according to a second control signal, and outputting the first control signal during an alternate activation of the third and fourth switching circuits;

a signal output unit having first and second output transistors coupled to each other and to the second control signal, the signal output unit producing a first output voltage according to a first state of the second control signal and producing a second output voltage according to a second state of the second control signal;

a third transistor coupled to a voltage source and receiving a first signal corresponding to the input signal at a gate during an activation of the first switching circuit, the third transistor outputting a driving voltage;

a fourth transistor, coupled to the third transistor, receiving a second signal corresponding to the first control signal of a first state at a gate during an activation of the third switching circuit and storing the driving voltage from the third transistor, the fourth transistor receiving the second signal of a second state during a deactivation of the third switching circuit and outputting the stored driving voltage to the first output transistor;

a fifth transistor receiving a third signal corresponding to the first control signal at a gate during an activation of the fourth switching circuit, storing an output voltage from the second output transistor, and outputting the stored output voltage when activated; and a sixth transistor, coupled to the fifth transistor, receiving a fourth signal corresponding to the input signal at a gate during an activation of the second switching circuit and reducing the stored output voltage from the fifth transistor to a ground potential.

9. The device according to claim 8, wherein the signal output unit includes a CMOS type inverter having a PMOS transistor and an NMOS transistor, and wherein a drain of the PMOS transistor is connected to a drain of the NMOS transistor.

10. The device according to claim 8, wherein the third and fourth transistors are PMOS transistors, and the fifth and sixth transistors are NMOS transistors.

11. The device according to claim 8, wherein a maximum voltage of the first and second control signals is about 66% of the driving voltage.

12. The device according to claim 8, wherein a minumum voltage of the first and second control signals is about 33% of the driving voltage.

13. The device according to claim 8, wherein the first control signal and the input signal are substantially in phase.

14. The device according to claim 8, wherein the second control signal has a phase opposite to a phase of the input signal.

15. The device according to claim 8, wherein the source and drain of each of the third and fourth transistors, or the source and drain of each of the fifth and sixth transistors, receive about 33% of the driving voltage at any one time.

16. An output voltage generating semiconductor device, comprising:

first and second switching circuits having gates connected to each other and to a first control signal, and the first and second switching circuits being connected to a common input signal;

third and fourth switching circuits having gates connected to each other and to a second control signal;

a signal output unit having first and second output transistors having gates connected to each other and to the second control signal;

a third transistor, coupled to a first voltage, receiving a first signal corresponding to the common input signal at a gate from the first switching circuit;

a fourth transistor, coupled to the third transistor, receiving a second signal corresponding to the first control signal from the third switching circuit at a gate, the fourth transistor being coupled to the first transistor of the signal output unit;

a fifth transistor, coupled to the second output transistor, receiving a third signal corresponding to the second control signal at a gate from the fourth switching circuit; and a sixth transistor, coupled to the fifth transistor, receiving a fourth signal corresponding to the common input signal at a gate from the second switching circuit, the sixth transistor being connected to a second voltage.

17. The device according to claim 16, wherein the third and fourth switching circuits pass the first control signal.

18. The device according to claim 16, wherein the first and third switching circuits each include PMOS transistors, and the second and fourth switching circuits each include NMOS transistors.

19. The device according to claim 16, wherein the first, third, and fourth transistors are PMOS transistors and the second, fifth, and sixth are NMOS transistors.

20. The device according to claim 16, wherein the first voltage is a driving voltage and the second voltage is ground.

21. The device according to claim 16, wherein a maximum voltage of the first and second control signals is about 66% of the first voltage.

22. The device according to claim 16 wherein a minumum voltage of the first and second control signals is about 33% of the first voltage.

23. The device according to claim 16, wherein the first control signal and the input signal are substantially in phase.

24. The device according to claim 16, wherein the second control signal has a phase opposite to a phase of the input signal.

25. The device according to claim 16, wherein source and drain of each of the third and fourth transistors, or a source and drain of each of the fifth and sixth transistors receive about 33% of the first voltage at any one time.

* * * * *